US 7,925,458 B2

(12) United States Patent
Kolker et al.

(10) Patent No.: US 7,925,458 B2
(45) Date of Patent: *Apr. 12, 2011

(54) ARC FAULT DETECTOR WITH CIRCUIT INTERRUPTER

(75) Inventors: David Kolker, Rego Park, NY (US);
Roger M. Bradley, North Bellmore, NY (US); Ross Mernyk, Brooklyn, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 195 days.

This patent is subject to a terminal disclaimer.

(21) Appl. No.: 12/032,431

(22) Filed: Feb. 15, 2008

(65) Prior Publication Data

US 2008/0140354 A1    Jun. 12, 2008

Related U.S. Application Data

(60) Continuation of application No. 11/357,708, filed on Feb. 17, 2006, now Pat. No. 7,333,920, which is a division of application No. 10/263,919, filed on Oct. 3, 2002, now Pat. No. 7,003,435.

(51) Int. Cl.
*G01R 31/00* (2006.01)
(52) U.S. Cl. ............... 702/59; 702/185; 361/5; 324/536
(58) Field of Classification Search .................... 702/60, 702/64–66, 70–71, 73, 124, 182–183, 185, 702/190; 361/2–5, 45–46, 78–79, 85–87, 361/93.1, 93.5–93.6; 324/508–509, 520, 324/522, 538–539
See application file for complete search history.

(56) References Cited

U.S. PATENT DOCUMENTS

| 3,904,859 A | 9/1975 | Poncelet |
| 4,356,443 A | 10/1982 | Emery |
| 4,376,243 A | 3/1983 | Renn et al. |
| 4,466,071 A | 8/1984 | Russell, Jr. |
| 4,618,907 A | 10/1986 | Leopold |
| 4,658,322 A | 4/1987 | Rivera |
| 4,709,293 A | 11/1987 | Gershen et al. |
| 4,851,782 A | 7/1989 | Jerrings et al. |
| 4,878,144 A | 10/1989 | Nebon |
| 4,931,894 A | 6/1990 | Legatti |
| 4,933,630 A | 6/1990 | Dupraz |
| 4,939,495 A | 7/1990 | Peterson |
| 5,121,282 A | 6/1992 | White |
| 5,185,684 A | 2/1993 | Beihoff et al. |
| 5,185,686 A | 2/1993 | Hansen et al. |

(Continued)

FOREIGN PATENT DOCUMENTS

WO    WO 2005/062917    7/2005

OTHER PUBLICATIONS

"Technology for Detecting and Monitoring Conditions that Could Cause Electrical Wiring System Fires", UL Underwriters Laboratories, Inc., Sep. 1995.

*Primary Examiner* — Andrew Schechter
*Assistant Examiner* — Mary C O'Malley
(74) *Attorney, Agent, or Firm* — Carter, DeLuca, Farrell & Schmidt, LLP

(57) ABSTRACT

A method and apparatus are provided for detecting the occurrence of arcing of a conductor by monitoring the current on an AC power line.

31 Claims, 10 Drawing Sheets

U.S. PATENT DOCUMENTS

| | | |
|---|---|---|
| 5,202,662 A | 4/1993 | Bienwald et al. |
| 5,206,596 A | 4/1993 | Beihoff et al. |
| 5,223,795 A | 6/1993 | Blades |
| 5,224,006 A | 6/1993 | MacKenzie et al. |
| 5,280,404 A | 1/1994 | Ragsdale |
| 5,383,799 A | 1/1995 | Fladung |
| 5,432,455 A | 7/1995 | Blades |
| 5,434,509 A | 7/1995 | Blades |
| 5,459,630 A | 10/1995 | MacKenzie et al. |
| 5,519,561 A | 5/1996 | Mrenna et al. |
| 5,536,980 A | 7/1996 | Kawate et al. |
| 5,561,505 A | 10/1996 | Lewis |
| 5,561,605 A | 10/1996 | Zuercher et al. |
| 5,590,012 A | 12/1996 | Dollar, II |
| 5,600,524 A | 2/1997 | Neiger et al. |
| 5,682,101 A | 10/1997 | Brooks |
| 5,689,180 A | 11/1997 | Carlson |
| 5,715,125 A | 2/1998 | Neiger et al. |
| 5,729,145 A | 3/1998 | Blades |
| 5,805,397 A | 9/1998 | MacKenzie |
| 5,805,398 A | 9/1998 | Rae |
| 5,815,352 A | 9/1998 | MacKenzie |
| 5,818,237 A | 10/1998 | Zuercher et al. |
| 5,818,671 A | 10/1998 | Seymour et al. |
| 5,825,598 A | 10/1998 | Dickens et al. |
| 5,834,940 A | 11/1998 | Brooks |
| 5,835,321 A | 11/1998 | Elms et al. |
| 5,839,092 A | 11/1998 | Erger et al. |
| 5,847,913 A | 12/1998 | Turner et al. |
| 5,886,606 A | 3/1999 | Tosaka et al. |
| 5,906,517 A | 5/1999 | Crane et al. |
| 5,940,256 A | 8/1999 | MacKenzie et al. |
| 5,946,179 A | 8/1999 | Fleege et al. |
| 5,963,406 A | 10/1999 | Neiger et al. |
| 5,986,860 A | 11/1999 | Scott |
| 5,999,384 A | 12/1999 | Chen et al. |
| 6,088,205 A | 7/2000 | Neiger et al. |
| 6,128,169 A | 10/2000 | Neiger et al. |
| 6,191,589 B1 | 2/2001 | Clunn |
| 6,218,844 B1 | 4/2001 | Wong et al. |
| 6,246,556 B1 | 6/2001 | Haun et al. |
| 6,259,996 B1 | 7/2001 | Haun et al. |
| 6,266,219 B1 | 7/2001 | Macbeth et al. |
| 6,275,044 B1 | 8/2001 | Scott |
| 6,295,190 B1 | 9/2001 | Rinaldi et al. |
| 6,313,641 B1 | 11/2001 | Brooks |
| 6,339,525 B1 | 1/2002 | Neiger et al. |
| 6,359,745 B1 | 3/2002 | Thomas et al. |
| 6,373,257 B1 | 4/2002 | Macbeth et al. |
| 6,381,112 B1 | 4/2002 | DiSalvo |
| 6,407,893 B1 | 6/2002 | Neiger et al. |
| 6,417,671 B1 | 7/2002 | Tiemann |
| 6,421,214 B1 | 7/2002 | Packard et al. |
| 6,426,632 B1 | 7/2002 | Clunn |
| 6,426,634 B1 | 7/2002 | Clunn et al. |
| 6,433,977 B1 | 8/2002 | Macbeth et al. |
| 6,433,978 B1 | 8/2002 | Neiger et al. |
| 6,538,862 B1 | 3/2003 | Mason, Jr. et al. |
| 6,538,863 B1 | 3/2003 | Macbeth |
| 6,545,574 B1 | 4/2003 | Seymour et al. |
| 6,567,250 B1 | 5/2003 | Haun et al. |
| 6,570,392 B2 | 5/2003 | Macbeth et al. |
| 6,577,484 B1 | 6/2003 | Macbeth et al. |
| 6,628,486 B1 | 9/2003 | Macbeth |
| 6,639,769 B2 | 10/2003 | Neiger et al. |
| 6,642,832 B2 | 11/2003 | Pellon et al. |
| 6,720,872 B1 | 4/2004 | Engel et al. |
| 6,731,483 B2 | 5/2004 | Mason et al. |
| 6,782,329 B2 | 8/2004 | Scott |
| 6,785,104 B2 | 8/2004 | Tallman et al. |
| 6,807,035 B1 | 10/2004 | Baldwin et al. |
| 6,807,036 B2 | 10/2004 | Baldwin et al. |
| 6,810,069 B2 | 10/2004 | Kojovic et al. |
| 6,876,528 B2 | 4/2005 | Macbeth |
| 6,937,027 B2 | 8/2005 | Koo et al. |
| 6,943,558 B2 | 9/2005 | Hale et al. |
| 6,972,572 B2 | 12/2005 | Mernyk et al. |
| 7,003,435 B2 | 2/2006 | Kolker et al. |
| 7,009,406 B2 | 3/2006 | Naidu et al. |
| 7,035,066 B2 | 4/2006 | McMahon et al. |
| 7,064,944 B2 | 6/2006 | Kim et al. |
| 7,068,481 B2 | 6/2006 | Radosavljevic |
| 7,149,065 B2 | 12/2006 | Baldwin et al. |
| 7,180,299 B2 | 2/2007 | Mernyk et al. |
| 7,180,717 B2 | 2/2007 | Kojovic et al. |
| 7,190,562 B2 | 3/2007 | Pellon et al. |
| 7,215,520 B2 | 5/2007 | Elms et al. |
| 7,227,441 B2 | 6/2007 | Skendzic et al. |
| 7,253,603 B2 | 8/2007 | Kovanko et al. |
| 7,253,637 B2 | 8/2007 | Dvorak et al. |
| 7,259,568 B2 | 8/2007 | Mernyk et al. |
| 7,268,989 B2 | 9/2007 | Parker et al. |
| 7,304,820 B2 | 12/2007 | Kato et al. |
| 7,309,993 B2 | 12/2007 | Dreihorn et al. |
| 7,319,574 B2 | 1/2008 | Engel |
| 7,321,227 B2 | 1/2008 | Fritsch et al. |
| 7,333,920 B2 | 2/2008 | Kolker et al. |
| 7,403,129 B2 | 7/2008 | Zhou et al. |
| 7,405,569 B2 | 7/2008 | Hagel et al. |
| 7,443,644 B2 | 10/2008 | Sung |
| 7,535,234 B2 | 5/2009 | Mernyk et al. |
| 2003/0072113 A1 | 4/2003 | Wong |
| 2005/0063535 A1 | 3/2005 | Walbeck et al. |
| 2005/0191902 A1 | 9/2005 | Kin et al. |
| 2005/0286184 A1 | 12/2005 | Campolo |
| 2006/0171085 A1 | 8/2006 | Keating |
| 2007/0262780 A1 | 11/2007 | Mernyk et al. |
| 2008/0140354 A1 | 6/2008 | Kolker et al. |
| 2009/0207535 A1 | 8/2009 | Mernyk et al. |

ARC FAULT DETECTOR WITH CIRCUIT INTERRUPTER

PRIORITY

This application is a continuation application of an application filed on Feb. 17, 2006 titled "Arc Fault Detector With Circuit Interrupter" and assigned U.S. application Ser. No. 11/357,708 now U.S. Pat. No. 7,333,920 which is a divisional application of an application filed on Oct. 3, 2002 titled "Arc Fault Detector With Circuit Interrupter" and assigned U.S. application Ser. No. 10/263,919 now U.S. Pat. No. 7,003,435.

BACKGROUND OF THE INVENTION

1. Field of the Invention

The present invention relates to arc fault detection and more particularly to apparatus and method for a stand alone arc fault detector and an arc fault detector in combination with a circuit interrupter device.

2. Description of the Prior Art

Circuit breakers, fuses and ground fault circuit interrupters (GFCIs) are commonly used devices for protecting people and property from dangerous electrical faults. Fatalities and loss of property, however, still occur, being caused by electrical faults that go undetected by these protective devices. One such type of electrical fault that typically goes undetected is arc faults. Arcs are potentially dangerous due to the high temperatures of the arcs. Thus, arcs have a high potential of creating damage, mostly through the initiation of fires. An arc, however, will only trip a GFCI if it produces sufficient current leakage to ground. In addition, an arc will trip a breaker only if the current, flowing through the arc, exceeds the trip parameters of the thermal/magnetic mechanism of the breaker. Therefore, a protection device that can detect and interrupt arcs that are not detectable by present day devices is needed. A protection device that is used to detect arcs and whose output is used to trigger a circuit interrupting mechanism is referred to as an Arc Fault Circuit Interrupter (AFCI).

The Consumer Product Safety Commission (CPSC), in 1992 estimated that "there were 41,000 fires involving home electrical wiring systems . . . which resulted in 320 deaths, 1600 injuries and $511 million in property losses." The CPSC further stated that "an electrically caused fire may occur if electrical energy is unintentionally converted to thermal energy and if the heat so generated is transferred to a combustible material at such a rate and for such a time as to cause the material to reach its ignition temperature." The two main causes of the unintentional conversion of electrical energy to heat are excessive current and arcing. Circuit breakers and fuses are currently available to mitigate the results of excessive current, but no commercial system exists to mitigate arcing.

A dangerous condition may develop whenever prolonged arcing exists regardless of whether it involves industrial, commercial or residential power lines. However, mobile homes and especially homes with antiquated wiring systems are particularly vulnerable to fires which are started due to electrical causes. CPSC studies have shown that the frequency of wiring system fires is disproportionately high in homes that are over 40 years old.

The causes of arcing are numerous, for example: aged or worn insulation and wiring; mechanical and electrical stress caused by overuse, over currents or lightning strikes; loose connections; and, excessive mechanical damage to insulation and wires. Two types of arcing occur in residential and commercial buildings: contact arcing and line arcing. Contact or series arcing occurs between two contacts in series with a load. In this instance the load controls the current flowing in the arc. Line or parallel arcing occurs between lines or between a line and ground. In this instance the arc is in parallel with any load present and the source impedance provides the only limit to the current flowing in the arc. It is important for any arc detection system that both contact arcing and line arcing be detected and that appropriate action be taken depending upon the severity of the arc.

An example of contact arcing is illustrated in FIG. 1. The conductors 114, 116 comprising the cable 110, are separated from each other and surrounded by an insulator 112. A portion of the conductor 114 is broken, creating a series gap 118 in conductor 114. Under certain conditions, arcing will occur across this gap, producing a large amount of localized heat. The heat generated by the arcing might be sufficient to break down and carbonize the insulation close to the arc 119. If the arc is allowed to continue, enough heat may be generated to start a fire.

A schematic diagram illustrating an example of line arcing is shown in FIG. 2. Cable 120 comprises electrical conductors 124, 126 covered by outer insulation 122 and separated by inner insulation 128. Deterioration or damage to the inner insulation at 121 may cause line fault arcing 123 to occur between the two conductors 124, 126. The deterioration or damage to the inner insulation could have been caused by an earlier lightning strike to the wiring system which could result in carbonizing the insulation, or it could have been cut by mechanical action such as a metal chair leg cutting into an extension cord.

The potentially devastating results of arcing are widely known and a number of methods of detecting arcs have been developed in the prior art. A large percentage of the prior art refers to detecting the high frequency signals generated on the AC line by arcs.

One major problem associated with any type of arc detection is false tripping. False tripping occurs when an ac detector produces a warning output, or disconnects a section of wiring from the voltage source, when a dangerous arcing condition does not actually exist. The two major causes of false tripping can be normal appliance arcing or the inrush currents created by inductive and capacitive appliances. These two situations generate high frequency signals on the power line that are very similar to those generated by dangerous arcing. Thus, to be a viable commercial device, an arc detector must be able to distinguish arcing signals from signals created by normal appliance use.

A wide range of prior art exists in the field of arc detection. Some of the prior art refers to specialized instances of arcing. For example, U.S. Pat. No. 4,376,243, issued to Renn, et al, discloses a device that operates with DC current. U.S. Pat. No. 4,658,322, issued to Rivera, discloses a device that detects arcing within an enclosed unit of electrical equipment. U.S. Pat. No. 4,878,144, issued to Nebon, discloses a device that detects the light produced by an arc between the contacts of a circuit breaker.

In addition, there are several patents that refer to detecting arcs of AC power lines that disclose various methods of detecting high frequency arcing signals. For example, U.S. Pat. Nos. 5,185,684 and 5,206,596, both issued to Beihoff et al., employ a complex detection means that separately detects the electric field and the magnetic field produced around a wire. U.S. Pat. No. 5,590,012, issued to Dollar, disclosed measuring the high frequency current in a shunted path around an inductor placed in the line, which can be the magnetic trip mechanism of a breaker. In a second detection circuit proposed by Dollar, a high frequency voltage signal is extracted from the line via a high pass filter placed in parallel with a load.

Various methods can be found in the prior art to authenticate arcing and to differentiate arcing from other sources of noise. U.S. Pat. No. 5,280,404, issued to Ragsdale, discloses looking for series arcing by converting the arcing signals to pulses and counting the pulses.

In addition, several patents detect arcing by taking the first derivative or second derivative of the detected signal. For example, see U.S. Pat. No. 5,224,006, issued to MacKenzie et al., and U.S. Pat. Nos. 5,185,684 and 5,206,596, issued to Beihoffet al.

Blades uses several methods to detect arcs as disclosed in U.S. Pat. Nos. 5,223,795; 5,432,455 and 5,434,509. The Blades device is based on the fact that detected high frequency noise must include gaps at each zero crossing, i.e., half cycle, of the AC line. To differentiate arcing from other sources of noise, the Blades device measures the randomness and/or wide bandwidth characteristics of the detected high frequency signal. The device disclosed in U.S. Pat. No. 5,434,509 uses the fast rising edges of arc signals as a detection criterion and detects the short high frequency bursts associated with intermittent arcs.

U.S. Pat. No. 6,561,605, issued to Zuercher et al., discloses a method of detecting arcing by sensing cycle to cycle changes in the AC line current. Differences in samples taken at the same point in the AC cycle are then processed to determine whether arcing is occurring.

SUMMARY OF THE INVENTION

There is here disclosed a method and apparatus for detecting the occurrence of arcing of a conductor by monitoring the current on an AC power line. The signal detected is split and directed along four separate paths to generate four signals having separate characteristics which represent the current in the line. A first path is for a signal representative of the current flowing in the line. A second path is for a signal having a pulse for each occurrence of a positive step change in current that is significant and has a di/dt value above a predetermined value. A third path is for a signal having a pulse for each occurrence of a negative step change in current that is significant and has a di/dt value above a predetermined value. A fourth path is for a signal having a voltage level representative of the broadband noise signal on the line. Using at least one of five different methods in combination with one of three input signals, a reference signal designated as "SINE" is generated. The SINE signal generated in combination with a CURRENT input is used to produce a control waveform "DELTA". DELTA can be represented as a relative value or as an absolute difference between the SINE and the CURRENT. Each occurring half cycle of the DELTA signal is analyzed by, for example, a micro-controller for specific identifiable characteristics found to indicate the presence of arcing. Upon the detection of arcing, an output signal can be generated to activate a circuit interrupting mechanism, sound an audio alarm and/or alert a central monitoring station.

The arc detector of the present invention can be implemented as a stand alone device or it can be implemented in combination with an existing circuit interrupting device. The term "circuit interrupting device" is here defined to mean any electrical device used to interrupt current flow to a load and includes, but is not limited to devices such as Ground Fault Circuit Interrupters (GFCIs), Immersion Detection Circuit Interrupters (IDCIs) or Appliance Leakage Circuit Interrupters (ALCIs).

The arc detector here disclosed can be combined with other types of circuit interrupting devices such a GFCI, IDCI or ALCI to create a multipurpose device. In the case of a GFCI, the arc detection circuitry can be placed onboard the same silicon chip typically used in today's GFCI devices. In some instances, some of the pins of commonly used GFCI integrated circuits can be converted for multifunction operation. The AFCI can be powered from the same power supply that provides power to the circuit interrupting device. This combined approach can result in reduced manufacturing costs as the mechanical parts of the circuit interrupting device such as the trip relay and the mechanical contact closure mechanisms will serve dual purposes. In addition, adding AFCI circuitry to an existing circuit interrupting device is a logical enhancement of such present day devices. In particular, it is logical to enhance a GFCI with AFCI circuitry since a GFCI can detect arcing in certain situations including any condition whereby an arc produces leakage current to ground.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures do not depart from the spirit and scope of the invention is its broadest form.

BRIEF DESCRIPTION OF THE DRAWINGS

Other aspects, features, and advantages of the present invention will become more fully apparent from the following detailed description, the appended claim, and the accompanying drawings in which similar elements are given similar reference numerals.

DESCRIPTION OF THE PREFERRED EMBODIMENT(S)

Figure 1:
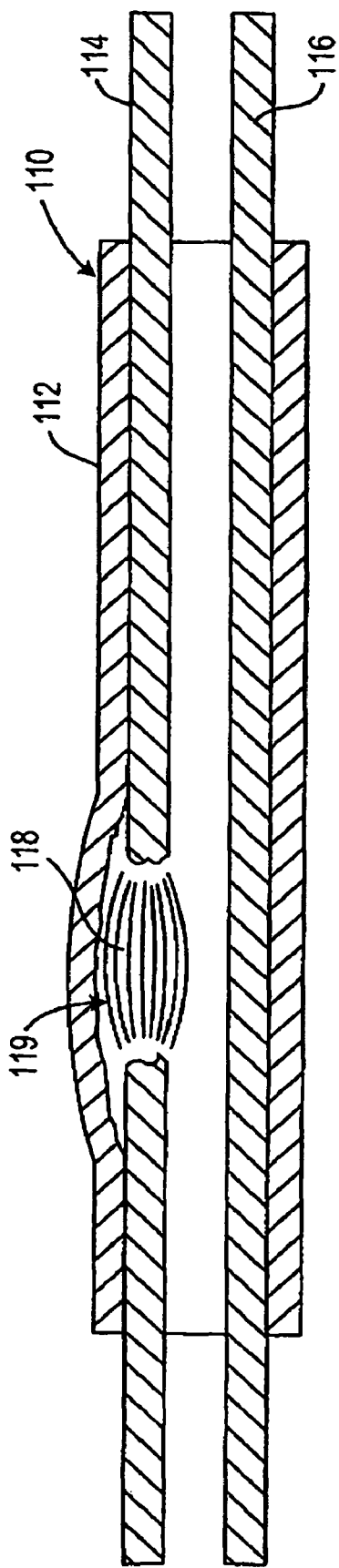
FIG. 1 is a schematic diagram illustrating an example of contact arcing in a current carrying conductor.
Figure 2:
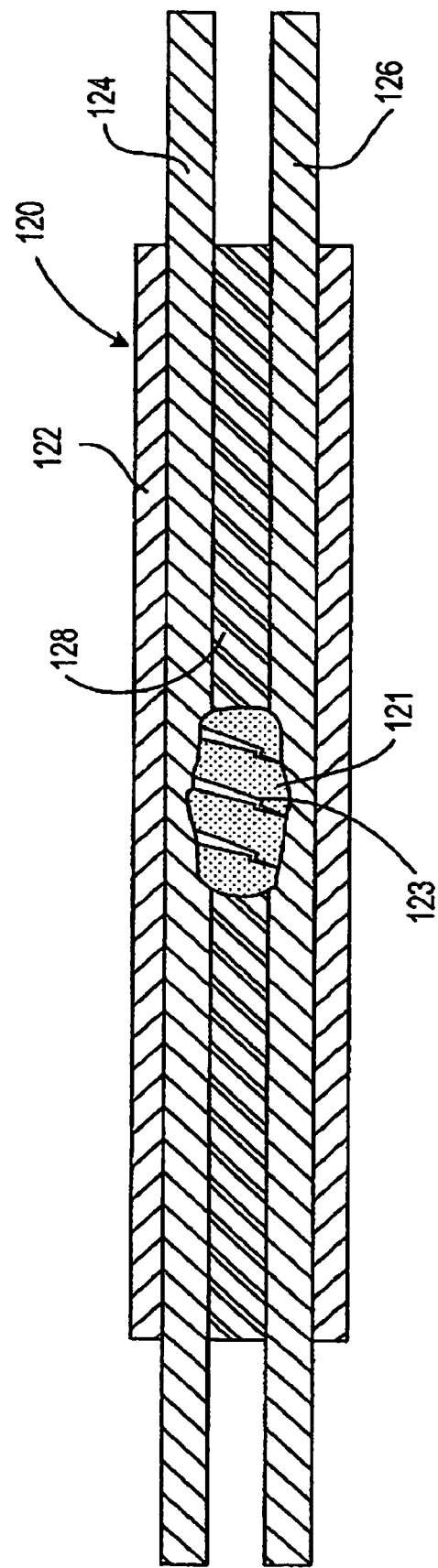
FIG. 2 is a schematic diagram illustrating an example of line arcing between two current carrying conductors.
Figure 3:
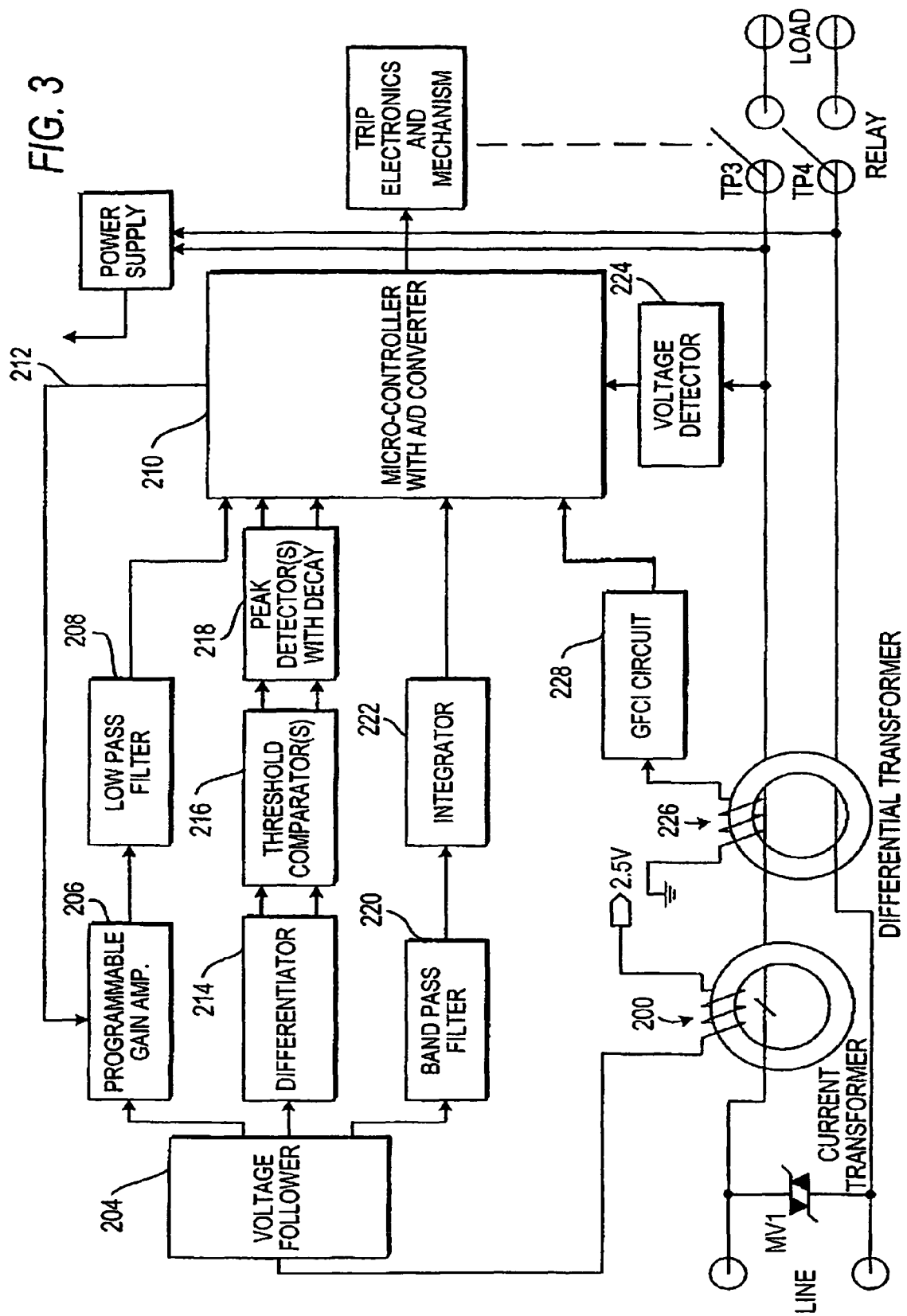
FIG. 3 is a block diagram of an Arc Fault Circuit Interrupter in accordance with the principles of the invention.

Referring to FIG. 3, there is illustrated a block diagram of structure in accordance with the principles of the invention. The current waveform present on the AC line is extracted via a toroidal current to voltage transformer 200. The transformer 200 should be capable of handling high currents (e.g. 200 A) in the primary with minimal saturation; and provide high currents with minimal distortion of the signal produced on the secondary winding. Additionally, the transformer should have a bandwidth sufficient to pass the frequency signals used by the high frequency noise detection circuitry. In place of the transformer 200, a current shunt located in the line can be used. A purely resistive shunt has the benefit of not imposing a phase shift on the signal, while a current transformer has the benefit of providing isolation from the line. If a current transformer is used, one end of the secondary is referenced to 2.5 volts with the other end being connected to the input of a voltage follower 204. If a shunt is used in the line, the line side of the shunt is referenced to 2.5 volts. With a shunt, the voltage drop is referenced to its line side that is 180 degrees out of phase with the current flow. By making the amplifiers in the circuit inverting, the voltage signal representing the current is back in phase with the actual current before it is sampled by a micro-controller 210.

The voltage generated across the secondary winding of transformer 200 is fed to voltage follower 204 which splits the signal, by electronics, into three signals, each of which is directed along a specific path. The voltage follower and the specific paths along which the split signals are carried can be considered to be a signal modifying means. The voltage follower provides enough current to drive the output signals along the various paths regardless of the current supplied by the current transformer. A first output signal from the voltage follower is fed along a first path which consists of a programmable gain amplifier 206, the output of which is fed through a low pass filter 208 to the micro-controller which includes a digital-to-analog (D/A) converter 210. The first path provides the D/A converter with a representation of the current flowing in the line. The programmable gain amplifier 206 is controlled by a signal from the micro-controller via line 212, which scales the voltage signal to the amplifier 206 by one of a variety of scales. For example, three data lines from the micro-controller will produce 8 possible scales. A set of scales of times.1, .times.2, .times.4, .times.8, times.16, .times.32, and .times.64 was found to be sufficient to keep the signal at the A/D input sufficiently large, without clipping at 5V an 0V across the range of 5 A peak to 320 A peak.

The amplifier 206 is normally set to its most sensitive setting (.times.64) and the micro-controller will reduce the scaling as the A/D reads signals that have been clipped at 5V or 0V. Signals above 320 A are allowed to clip at 5V and 0V as these are abnormal current levels. The low pass filter 208 which follows the programmable gain amplifier cuts out high frequency noise and has a corner frequency roughly half the sampling frequency of the A/D converter.

A second signal from the voltage follower is used to generate two signals; one signal being a pulse for each occurrence of a positive step change in current that is significant and has a di/dt value above a predetermined value, and a second signal being a pulse for each occurrence of a negative step change in current that is significant and has a di/dt value above a predetermined value. The second signal from the voltage follower is fed to differentiator 214 which responds to the rate of change of current in the line. The two output signals of the differentiator are fed to two threshold comparators 216 which help to eliminate noise. The negative threshold output, compared to 2.5V, is fed to a negative peak detector with an RC network decay 218, which stretches any short lived negative di/dt signals. The positive threshold output, compared to 2.5v, is fed to a positive peak detector with an RC network decay 218, which stretches any short lived positive di/dt signals. The time constants of the two RC networks providing the peak decay are fast enough to allow the detection of more than one di/dt peak within a half cycle. The signals from the negative and positive peak detectors 218 are fed to the micro-controller 210.

A third signal from the voltage follower is used to produce a voltage having a level that is representative of the broadband noise signal on the line. The third signal from the voltage divider is fed to band pass filter 220, the output of which is fed thru an integrator 222 to the micro-controller 210. The signal representative of the broadband noise on the line is used to determine if an increase in broadband noise correlates with the general waveform arc characteristics. This input is given a higher weight if the current waveform is not sufficient, within a half cycle, to create a sine wave which can be compared with the current waveform. The main purpose of the band pass filter 220 is to remove the fundamental frequency (e.g. 60 Hz) and other low frequency components of the current signal. The integrator 222 produces a voltage level representative of the high frequency noise on the line. A programmable gain amplifier may also be employed following the band pass filter to provide a greater range of high frequency noise detection.

The signal from the low pass filter 208 represents the current in the line (CURRENT); the two signals from the peak detectors 218 represent the negative and positive di/dt of the current in the line (DIFF+ and DIFF−); and the signal from the integrator 222 represents the high frequency noise on the line (HFN). These four signals are fed to the A/D converter within the micro-controller where they are sampled. In FIG. 3, the A/D converter is shown as being an integral part of the micro-controller. However, if desired, the A/D converter can be separate from the micro-controller. A typical sampling rate is 32 samples per half cycle.

A fifth input to the micro-controller and A/D converter 210 is a line voltage signal from a voltage detector 224 which is sampled by the A/D converter for detecting zero crossings.

A sixth input to the micro-controller and A/D converter 210 is an amplified and filtered signal from a differential transformer 226 which encompasses both the phase and neutral wires of the line. This signal is integrated and compared with other signals within the micro-controller to provide ground fault detection in addition to arc fault detection. In some applications it may be desirable to separate the ground fault detection circuit 228 from the arc fault detection circuit to reduce the software overhead of the micro-controller without adding significantly to the circuitry on the PC board.

Ground Fault Circuit Interrupters (GFCI) are well known electrical devices in common use today. They are used to help protect against electrical shock due to ground faults. A GFCI is basically a differential current detector which trips a contact mechanism when 5 mA or more of unbalanced current is detected between the phase wire and the neutral wire of an AC electrical power line. The unbalanced current detected is assumed to be flowing through a human who accidentally touches the phase wire. The current flows through the human to ground rather than returning through the differential transformer via the neutral wire, to create the current imbalance described above. It is to be noted that, not only current through a human, but also an appliance with inherent leakage to ground of 5 mA or more will also trip the GFCI to disconnect the flow of current to the load.

Figure 4:
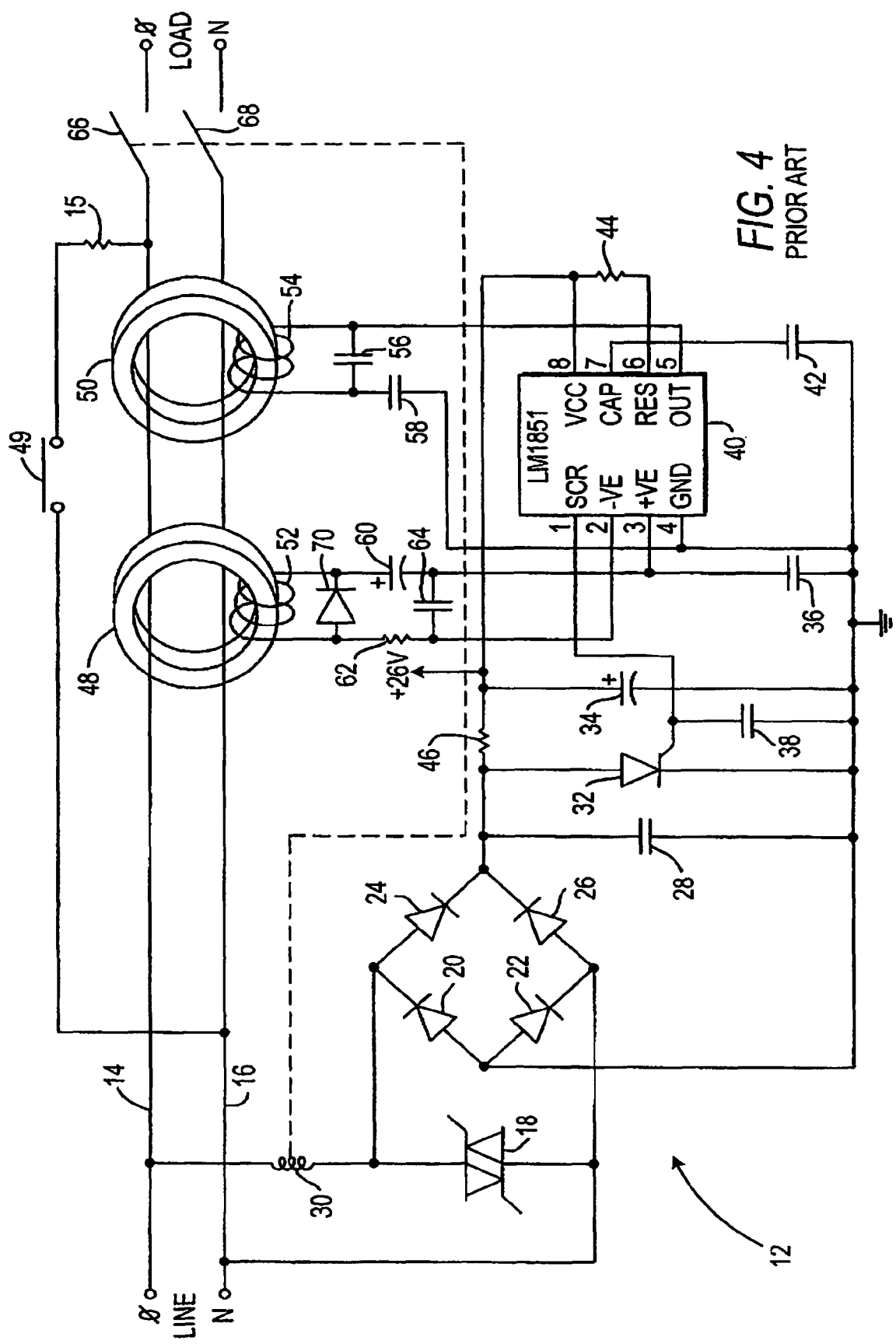
FIG. 4 is a schematic diagram illustrating a prior art ground fault circuit interrupter device.

A schematic diagram illustrating a prior art ground fault circuit interrupter (GFCI) device is shown in FIG. 4. A typical prior art GFCI, generally referenced 12, comprises two current transformers consisting of magnetic cores 48,50 and coils 52, 54, respectively, coupled to integrated circuit 40 which may comprise the chip identified as LM 1851 manufactured by National Semiconductor. A relay coil 30 is placed between the phase and one input to a full wave bridge rectifier. AC power from the phase 14 and neutral 16 conductors is full wave rectified via a full wave rectifier comprising diodes 20, 22, 24, 26. A metal oxide varistor (MOV) 18 is placed across the phase and neutral conductors for protection. The output of the bridge is coupled across capacitor 28 and silicon controlled rectifier (SCR) 32. The gate of the SCR is coupled to ground via capacitor 38 and to pin 1 of chip 40.

A diode 70 located across the coil 52 is coupled to pins 2 and 3 via resistor 62 and capacitors 64, 60. Pin 3 is also coupled to ground via capacitor 36. Coil 54 is coupled to pins 4 and 5 of chip 40 via capacitors 58, 56. Pin 4 is also coupled to ground. Pin 6 of chip 40 is coupled to pin 8 via resistor 44 and pin 7 is coupled to ground via capacitor 42. Pin 8 is also coupled to capacitor 34 and to resistor 46. The voltage on pin 8 serves as the 26 V supply voltage for the GFCI circuitry. Line side electrical conductors, phase 14 and neutral 16, pass through the transformers to the load side phase and neutral conductors. A relay, consisting of switches 66, 68, associated with the phase and neutral conductors, respectively, function to open the circuit in the event a ground fault is detected. The switches 66, 68 are part of a double throw relay which includes coil 30. The coil 30 in the relay is energized when the GFCI circuitry turns on the silicon controlled rectifier (SCR) 32. In addition, the GFCI 12 comprises a test circuit comprised of a momentary push button switch 49 connected in series with a resistor 15. When the switch 49 is pressed, a temporary simulated ground fault, i.e., a temporary differential current path, from phase to neutral is created in order to test the operation of the GFCI 12.

As noted above, the arc fault detector here disclosed detects arcing in an AC electrical distribution system. From a broad band signal representative of the current in one of the conductors, four separate signals are generated. The first signal generated represents the current (CURRENT) flowing in the line. The second signal generated contains a pulse for each occurrence of a positive step change in current that is significant and has a di/dt value above a predetermined value (positive di/dt signal). The third signal generated contains a pulse for each occurrence of a negative step change in current that is significant and has a di/dt value above a predetermined value (negative di/dt signal). The fourth signal generated produces a voltage level indicative of the broadband noise signal on the line.

Figure 5:
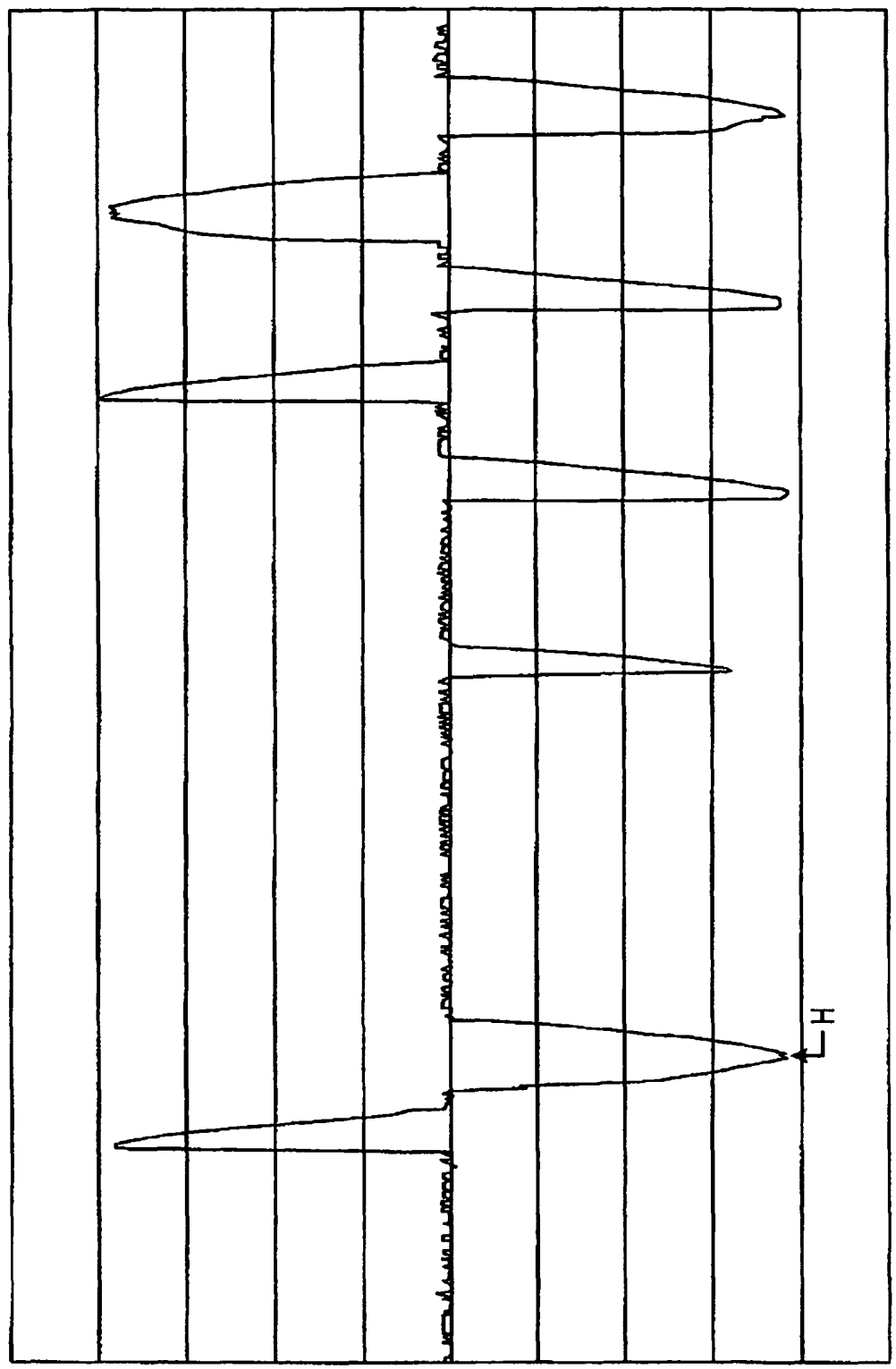
FIG. 5 is a plot of current waveform of an arcing signal.
Figure 6:
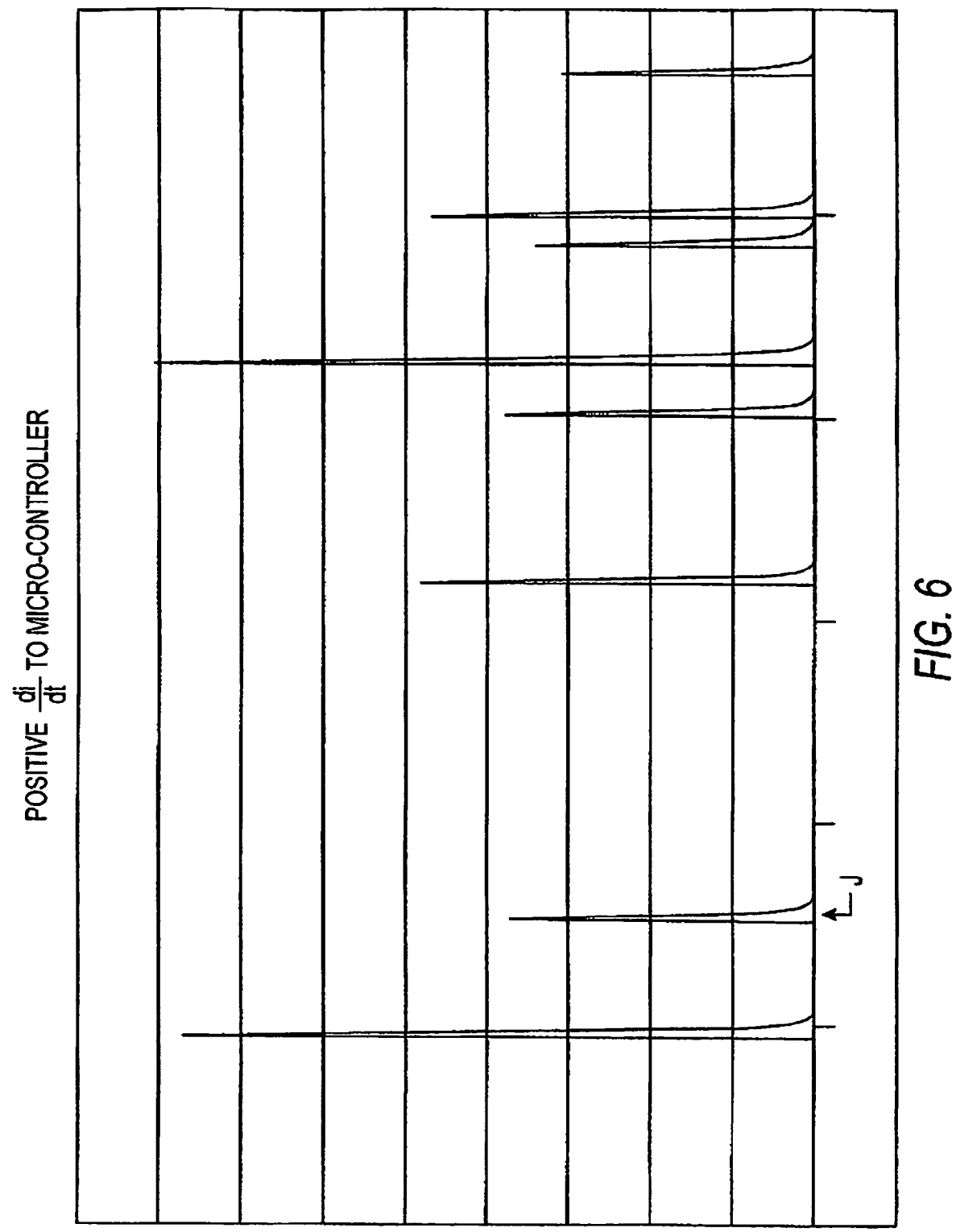
FIG. 6 is a plot of the positive di/dt signal fed to the micro-controller.
Figure 7:
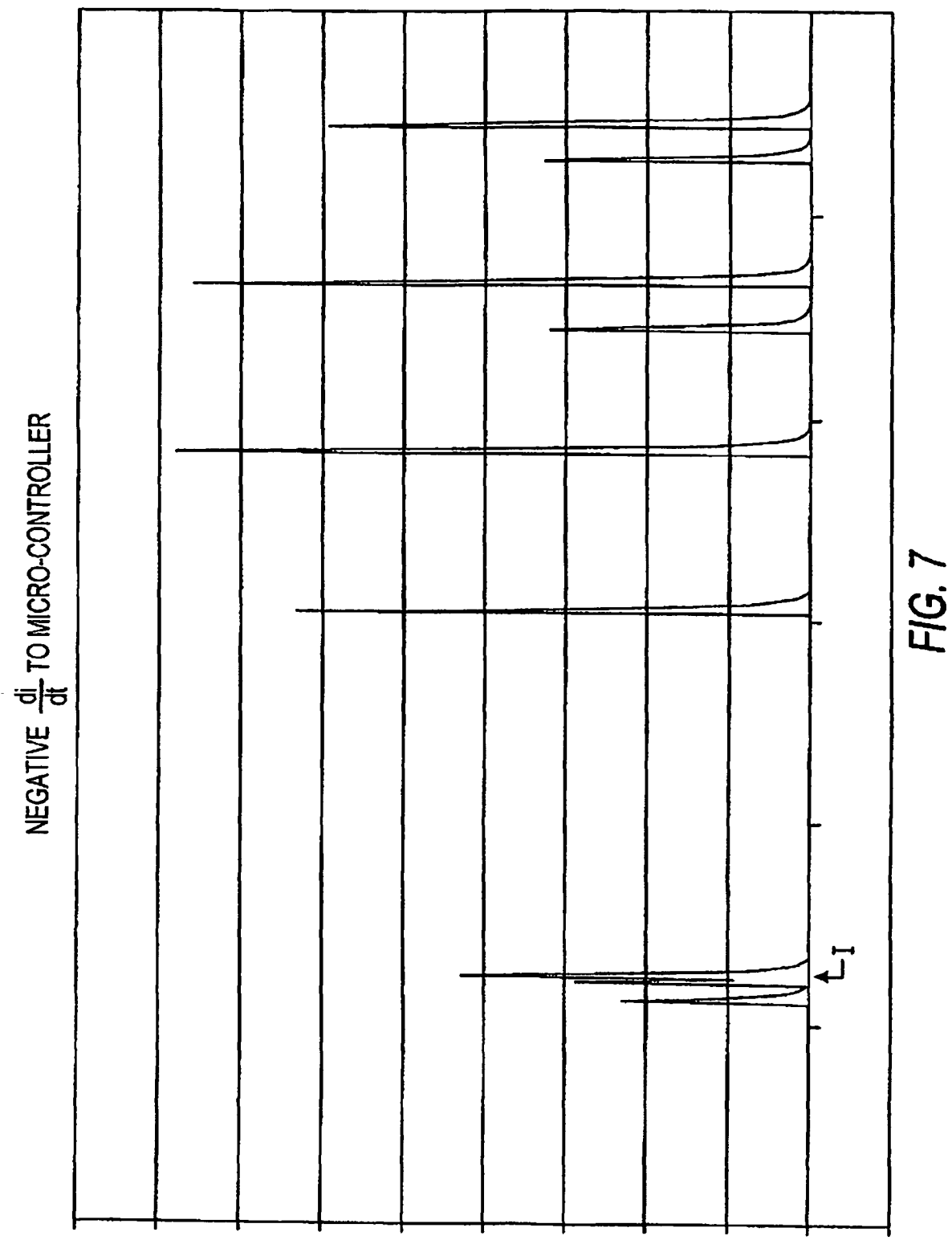
FIG. 7 is a plot of the negative di/dt signal fed to the micro-controller.
Figure 8:
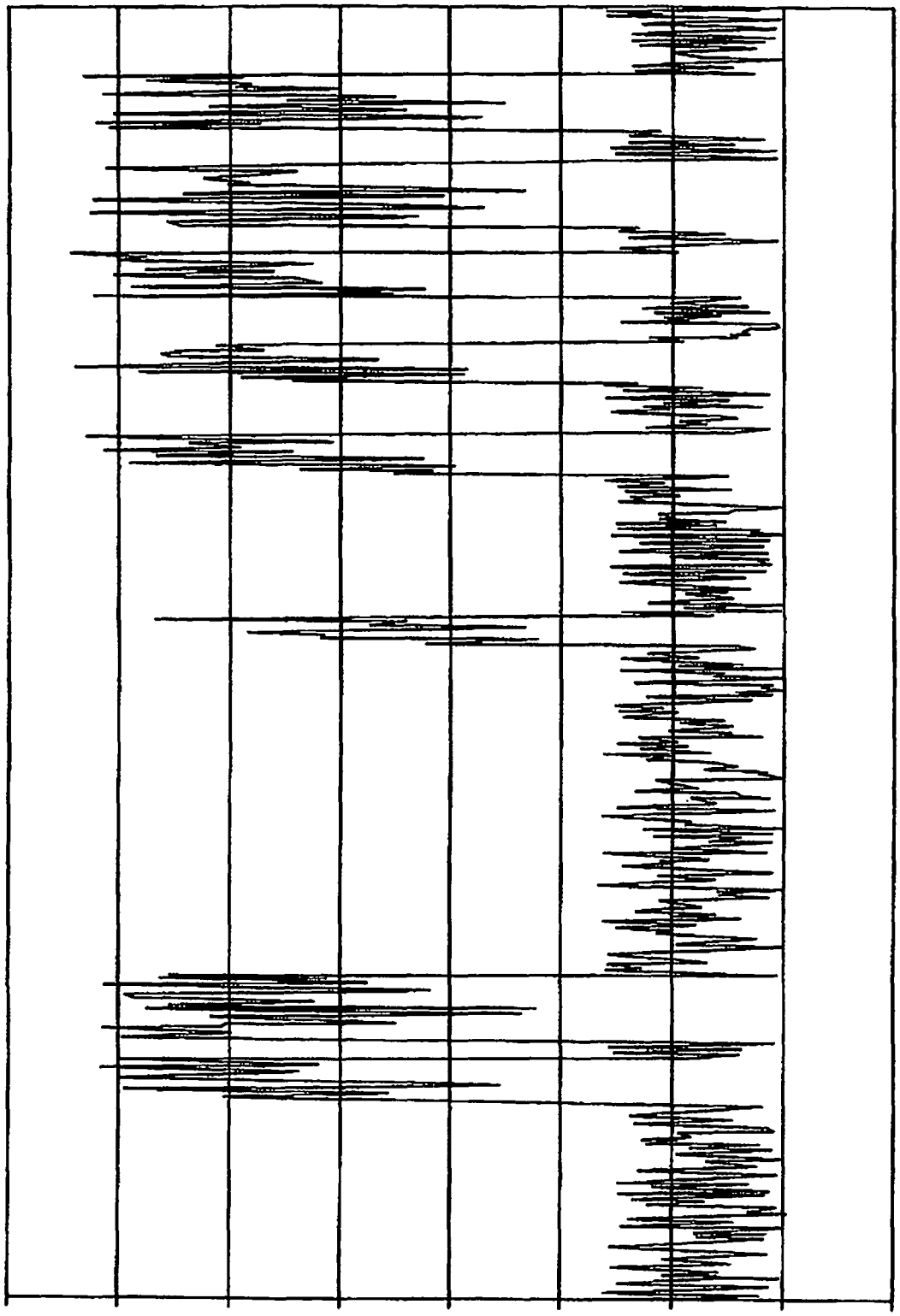
FIG. 8 is a plot of the noise signal fed to the micro-controller.
Figure 9:
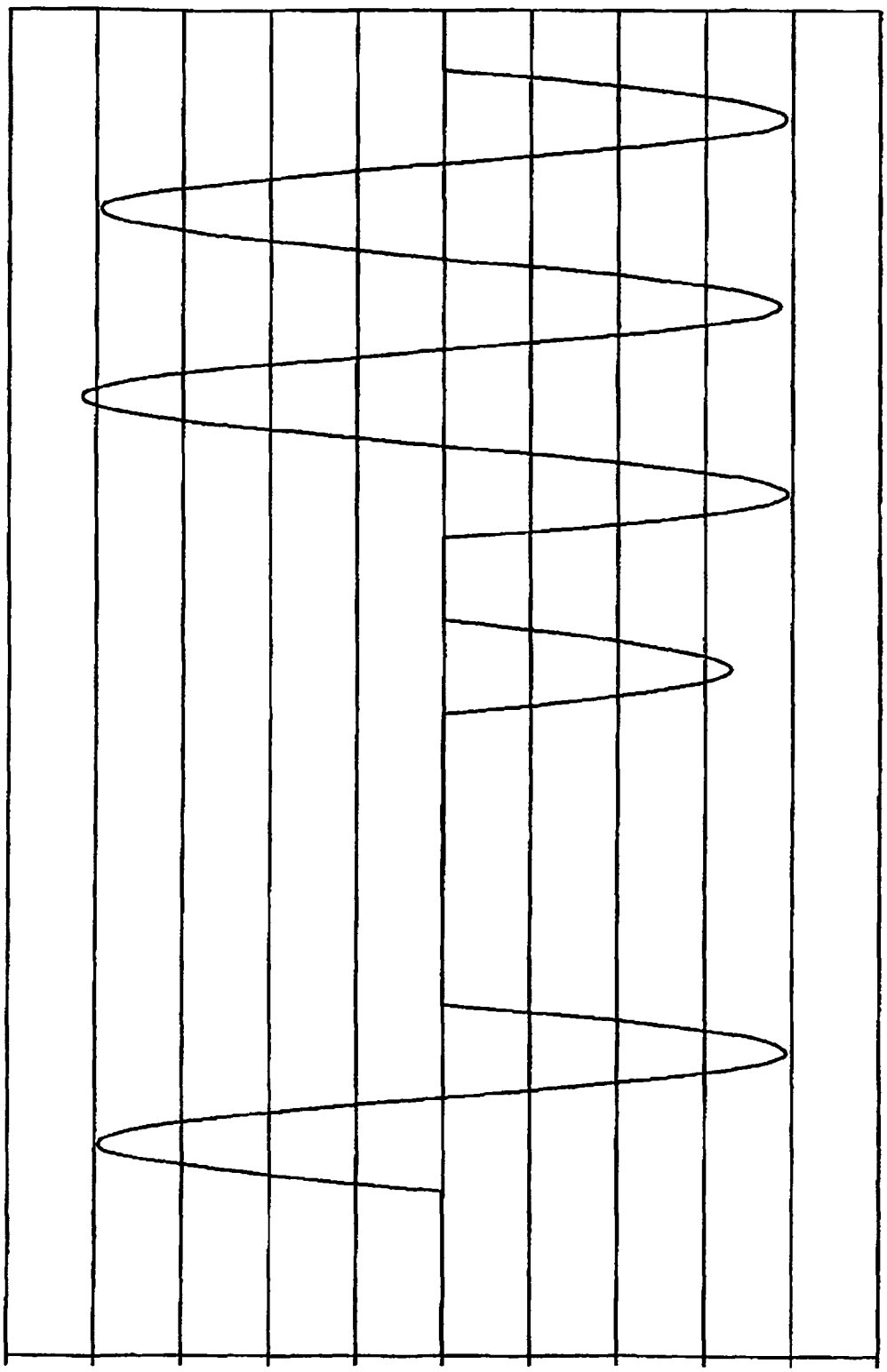
FIG. 9 is a plot of the created SINE waveform, the reference signal generated by the micro-controller; and, FIG. 10 is a plot of the Delta signal, the difference between the reference signal and the current signal.

FIG. 5 is a plot of a current waveform of an arcing signal. FIG. 6 is a plot of the positive di/dt signal. FIG. 7 is a plot of the negative di/dt signal. FIG. 8 is a plot of the wide band noise signal. The signal representative of the line current; the CURRENT signal; is compared with a SINE signal, in the time domain, to determine if it has the general waveform characteristics of arcing present and if half cycles of current that sometimes occur with sputtering arc faults are missing.

The SINE signal is generated by one of five algorithms each of which uses, as an input, the raw input current signal, or the signal from a multipoint running finite impulse response (FIR) or infinite impulse response (IIR) filter applied to the current signal. Thus, there is here disclosed fifteen separate and distinct methods for generating the SINE signal which is used to identify an arc fault.

Once the SINE is obtained for each half cycle of the CURRENT signal, the CURRENT signal is subtracted from the SINE to produce a waveform here referred to as the DELTA waveform.

The SINE is obtained as follows:

(1) Using a Finite Impulse Response (FIR) filter, infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT at that point to obtain the peak value of the CURRENT, where K is applied to FIR or IIR data to correct for sampling of a pure sine wave, (E) assume real zeros are exactly 1/240 sec. on either side of the peak, (F) lockout 1/4 cycle from leading zero cross when advancing to the next zero.

(2) Using a Finite Impulse Response (FIR) filter infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT at that point to obtain the peak value of the CURRENT, where K is applied to FIR or IIR data to correct for sampling of a pure sine wave, (E) assume zeros are exactly halfway between adjacent CURRENT peaks, (F) when advancing to next zero, begin looking at present peak.

(3) Using the CURRENT and Voltage data set sets from a multipoint running FIR and/or from multipoint IIR filters, (A) use the zero crosses from the FIR or IIR or the raw VOLTAGE waveform, and (B) use peak height of K (or 1) times FIR, IIR or raw CURRENT at the point halfway between the zeros to obtain the peak value of the CURRENT, where is applied to FIR or IIR data to correct for sampling of a pure sine wave.

(4) Using a Finite Impulse Response (FIR) filter, infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT, at that point to obtain the peak value of the CURRENT, where K is applied to FIR or IIR data to correct for sampling of a pure sine wave, (E) assume real zeros are exactly 1/240 sec. on either side of the peak, (F) when advancing to the next zero, begin looking at the present peak.

(5) Using a Finite Impulse Response (FIR) filter infinite impulse response (IIR) filter, or raw current, (A) find a starting FIR, or IIR, or raw CURRENT zero cross, (B) find average of following half cycle of FIR, or IIR, or raw CURRENT, (C) find peak of same polarity as average in that half cycle, (D) use peak height of K (or 1) times FIR, IIR or raw CURRENT at that point to obtain the peak value of the CURRENT, where K is applied to FIR or IIR data to correct for sampling of a pure sine wave, (E) when advancing to next zero, begin looking at present peak, and (F) assume zeros are exactly X/2 on either side of peak, where X is the average frequency form the preceding three cycles of the FIR or IIR or raw VOLTAGE waveform.

The waveform DELTA can be represented as the absolute difference between the SINE and the CURRENT or it can be represented as a relative value. When DELTA is to be represented as a relative value, the following relationship can used to obtain DELTA: DELTA=(SINE−CURRENT)/SINE The running average of the current flowing in the line is also calculated from the CURRENT input. If the running average of the current in the line is above a preset value for a preset time, the Arc Fault Circuit Interrupter will trip. If the running average is low, more arc events will have to be detected before the Arc Fault Circuit Interrupter will trip. This process adds noise immunity to the device.

Figure 10:
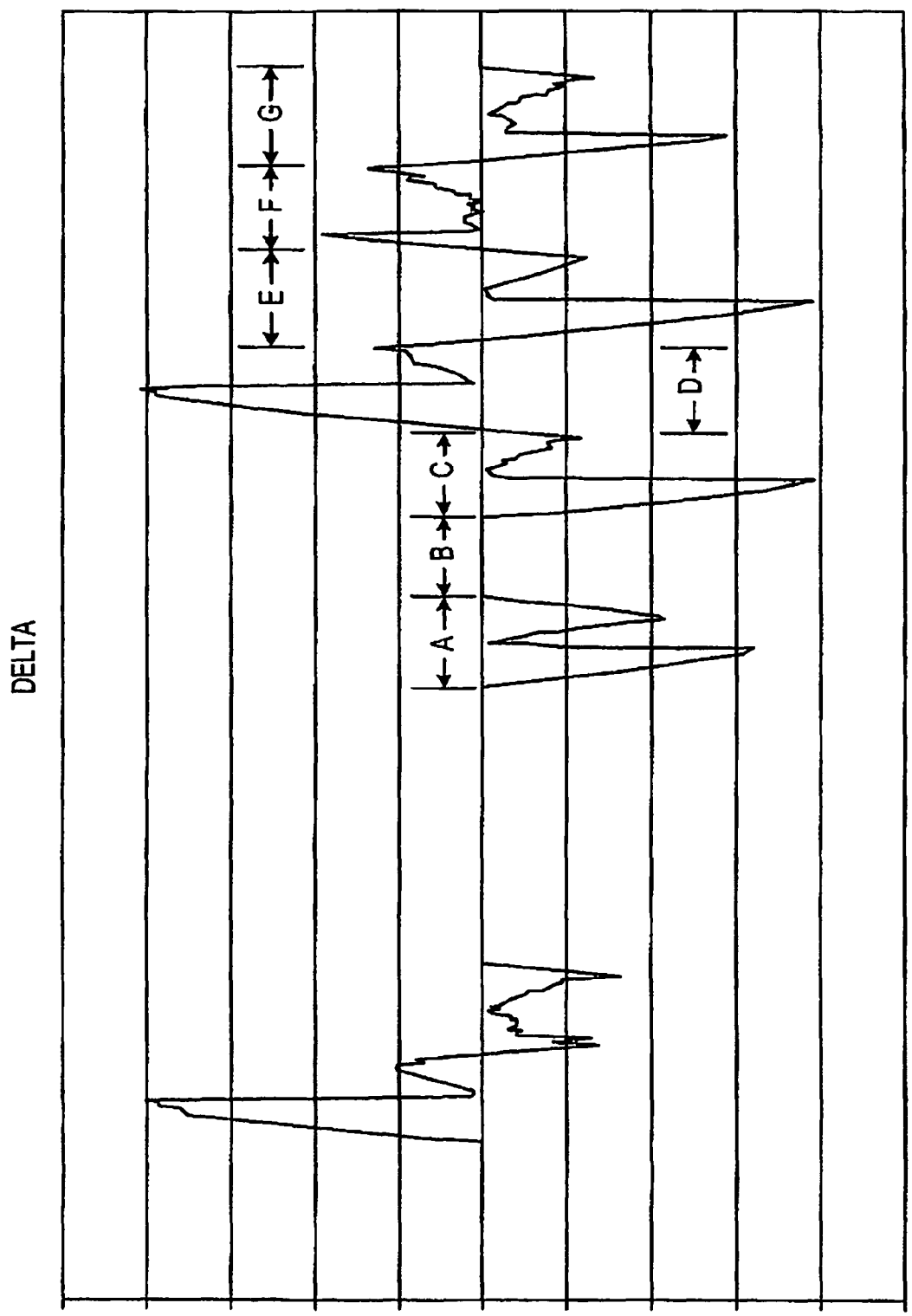

The DELTA data stream is analyzed by the micro-controller 210, continuously a half cycle at a time and, using at least one of the criteria below to determine if arcing is present:

Arcing is indicated if there are two peaks in the DELTA waveform within a half cycle. See FIG. 10, half cycles A, C, D, E and F.

Arcing is further indicated if the second peak of two peaks in a half cycle in the DELTA waveform is lower than the first peak. See FIG. 10, half cycles A, C, D, E and G.

Arcing is further indicated if the half cycles which contain two peaks within the DELTA waveform are surrounded by a period of one or more half cycles when a lower current flows. See FIG. 10, half cycles A and C on either side of half cycle B which, as illustrated in FIG. 5, is at a time when a lower current is flowing.

Under low load conditions the CURRENT signal may be too weak to create a SINE signal. This can occur, for example, when a load such a motor is phase dimmed at a low speed or the load is a light that is very dim. In this instance, the positive and negative di/dt Differential (DIFF) inputs and the High Frequency Noise (HFN) input signals are given more weight. The present invention employs the DIFF and HFN signals for arc detection as follows;

Arcing is indicted if two step-changes of current occur in a half cycle where the first has a di/dt spike of the same polarity as the current, and the second has a di/dt spike of opposite polarity to the current. See FIG. 5, current pulse H, a negative polarity pulse; FIG. 7, pulse I, the first going di/dt pulse having the same polarity as the current and FIG. 6, pulse J having a polarity opposite to the current.

Arcing is further indicated by randomness in the time between di/dt spikes. See FIGS. 6 and 7.

Arcing is further indicated by half cycles containing two di/dt spikes surrounding a period of one or more half cycles when a much lower arcing current is flowing.

Arcing is indicated when the HFN input signal is high between two di/dt spikes and is low during the rest of the half cycle.

Arcing is further indicated if the HFN input peaks between the two di/dt events.

Arcing is further indicated if the HFN follows a sine curve between the two di/dt events.

Arcing is further indicated by half cycles containing the above three HFN signal characteristics surrounding a period of one or more half cycles when a much lower HFN signal is present.

Upon determining that an arc fault has occurred, the microcontroller drives one of its output pins high which turns on an SCR by supplying current to the gate of the SCR through a resistor. The activated SCR operates a solenoid connected to open a pair of contacts to remove power from the load. A capacitor can be placed across the gate and cathode of the SCR to prevent it from being turned on by voltage spikes on the line.

While there have been shown and described and pointed out the fundamental novel features of the invention as applied to the preferred embodiments, it will be understood that various omissions and substitutions and changes of the form and details of the method and apparatus illustrated and in the operation may be done by those skilled in the art, without departing from the spirit of the invention.

What is claimed is:

1. A method in an arc fault detecting device capable of being electrically connected to an electrical wiring system between line side phase and neutral conductors and load side phase and neutral conductors, said method detecting the occurrence of arcing of a conductor by monitoring the current on an AC power line, said method comprising:

detecting current in said conductor of the electrical wiring system and generating a signal representative of the detected current;

generating at least one modified signal which represents the filtered or unfiltered current detected in the conductor; and receiving the at least one modified signal by a controller and performing the following by the controller:

generating a SINE signal having half cycles and zero crossings from a raw input signal, or a signal from a finite impulse response (FIR) filter, or a signal from an infinite impulse response (IIR) filter;

comparing the generated SINE signal with the at least one signals generated from the signal modifying means to generate a DELTA signal;

analyzing the DELTA signal for at least one characteristic representative of the occurrence of an arc; and generating an output signal upon detection of the at least one characteristic representative of the occurrence of an arc, wherein the step of detecting current provides for the use of a current transformer, wherein the step of generating at least one modified signal provides a CURRENT signal representative of the current in the line, wherein the CURRENT signal is used by the controller to generate the SINE signal, and wherein the CURRENT signal is fed to a multipoint running finite impulse response filter to smooth the signal prior to being used to generate the SINE signal.

2. The method according to claim 1, wherein the CURRENT signal is fed to an infinite impulse response (IIR) filter to smooth the signal prior to being used to generate the SINE signal.

3. The method according to claim 1, wherein the step of generating at least one modified signal for generating the CURRENT signal provides for the use of a programmable gain amplifier controlled by the controller which scales the output signal to one of a number of scales.

4. The method according to claim 3, comprising a voltage follower located between the transformer and the programmable gain amplifier, and a low pass filter located between the programmable gain amplifier and the controller, wherein the programmable gain amplifier and the low pass filter operate as a D/A converter for generating the CURRENT signal.

5. The method according to claim 1, wherein the step of generating at least one modified signal provides negative and positive di/dt signals of the detected current in the line.

6. The method according to claim 5, wherein the step of generating at least one modified signal provides a signal of the high frequency noise on the line.

7. The method according to claim 1, wherein either the phase or neutral conductor is coupled to the current transformer.

8. The method according to claim 1, further comprising:
   detecting a ground fault between the conductors; and
   electrically disconnecting the load side phase and neutral conductors from the line side phase and neutral conductors based on the detection of the ground fault.

9. The method according to claim 1, wherein the controller is selected from the group consisting of a micro-controller, a microprocessor, an integrated circuit chip, a processor, and a CPU.

10. A method in an arc fault detecting device capable of being electrically connected to an electrical wiring system between line side phase and neutral conductors and load side phase and neutral conductors, said method detecting the occurrence of arcing of a conductor by monitoring the current on an AC power line, said method comprising:

detecting current in said conductor of the electrical wiring system and generating a signal representative of the detected current;

generating a CURRENT signal which represents the filtered or unfiltered current detected in the conductor; and receiving the CURRENT signal by a controller and performing the following by the controller:

generating a SINE signal having half cycles and zero crossings from a raw input signal, or a signal from a finite impulse response (FIR) filter, or a signal from an infinite impulse response (IIR) filter, when generating the SINE signal, locates a starting CURRENT zero crossing, finds the average of following half cycles of the CURRENT signal, finds a peak of the same polarity as the average in that half cycle, multiplies the peak height by the CURRENT at that point, assumes that real zero crossings are exactly 1/240 second on either side of the peak, and lockouts 1/4 cycle from the leading zero crossing when advancing to next zero crossing, subtracts the CURRENT signal from the generated SINE signal and divides the result by the SINE signal to obtain a DELTA signal, analyzes the DELTA signal for at least one characteristic representative of the occurrence of an arc, and generates an output signal upon detection of the at least one characteristic representative of the occurrence of an arc.

11. The method according to claim 10, wherein the controller analyzes the DELTA signal, continuously, a half cycle at a time to identifying arcing by detecting, in a half cycle, two peaks.

12. The method according to claim 11, wherein the controller further analyzes the DELTA signal for the occurrence of a second peak that is lower than the first peak to further identify arcing.

13. The method according to claim 12, wherein the controller still further analyzes the DELTA signal to obtain a further indication of arcing when a half cycle containing two peaks surrounds a period of one or more half cycles during low current flow.

14. The method according to claim 10, further comprising:
detecting a ground fault between the conductors; and
electrically disconnecting the load side phase and neutral conductors from the line side phase and neutral conductors based on the detection of the ground fault.

15. The method according to claim 10, wherein the controller is selected from the group consisting of a micro-controller, a microprocessor, an integrated circuit chip, a processor, and a CPU.

16. An arc fault detecting device electrically connected to an electrical wiring system between a line conductor and load conductor, said device comprising:

at least one transformer adapted to generate a voltage based on a current present on the line conductor;

a comparator configured to generate at least one signal based on the voltage generated by the transformer;

a first path configured to modify the at least one signal to represent the current present on the line conductor;

a second path configured to modify the at least one signal to represent at least one of a positive step change in the current as a function of time and a negative step change in the current as a function of time;

a third path configured to modify the at least one signal to represent a noise signal on the line conductor; and a controller electrically connected to the comparator by at least one of the first, second, and third path and configured to compare the at least one modified signal to a first waveform generated by the controller, wherein the controller generates a second waveform based on the comparison between the at least one modified signal and the first waveform to cause a switch to electrically disconnect the load conductor from the line conductor based on the second waveform, wherein the first path includes a programmable gain amplifier configured to output the at least one signal from the comparator to a low pass filter adapted to remove high frequency noise from the at least one signal to provide the at least one modified signal to the controller.

17. The arc fault detecting device according to claim 16, wherein the comparator is a operational amplifier.

18. The arc fault detecting device according to claim 16, wherein the switch is a silicon-controlled rectifier.

19. The arc fault detecting device according to claim 16, wherein the second path includes a differentiator configured to output the at least one signal from the comparator to at least one threshold comparator to remove noise from the at least one signal, the at least one threshold comparator configured to output the at least one signal to a peak detector configured to provide a negative threshold output of the current and a positive threshold output of the current to the controller.

20. The arc fault detecting device according to claim 16, wherein the third path includes a band pass filter adapted to remove low frequency noise from the at least one signal and configured to output the at least one signal from the comparator to an integrator configured to provide a voltage representative of the high frequency noise of the at least one signal to the controller.

21. The arc fault detecting device according to claim 16, further comprising a ground fault circuit interrupter configured to cause the switch to electrically disconnect the load conductor from the line conductor based on a detection of a ground fault by the ground fault circuit interrupter.

22. The arc fault detecting device according to claim 16, wherein the first waveform generated by the controller is based on at least one input signal from the at least one transformer.

23. The arc fault detecting device according to claim 16, wherein the comparison between the at least one modified signal and the first waveform represents an absolute difference therebetween.

24. The arc fault detecting device according to claim 16, wherein the controller is selected from the group consisting of a micro-controller, a microprocessor, an integrated circuit chip, a processor, and a CPU.

25. A method of detecting an arc fault between a line conductor electrically connected to a load conductor, comprising:

detecting a current present on the line conductor;
generating at least one signal based on the detected current;
modifying the at least one signal to represent the detected current;
generating a first waveform based on one of an unfiltered signal and a filtered signal;
comparing the first waveform with the at least one modified signal;

generating a second waveform based on the comparison between the first waveform and the at least one modified signal;

detecting at least one condition of the second waveform representative of the arc fault; and generating an output signal to electrically disconnect the load conductor from the line conductor based on the detection of the at least one condition, wherein the modifying step further comprises filtering the at least one signal via at least one of an infinite impulse response filter and a multipoint running finite impulse response filter prior to generating the first waveform using a microcontroller.

26. A method of detecting an arc fault between a line conductor electrically connected to a load conductor according to claim 25, wherein the output signal is generated by a controller based on the first waveform.

27. A method of detecting an arc fault between a line conductor electrically connected to a load conductor according to claim 25, wherein the at least one modified signal represents one of a positive step change in the current and a negative step change in the current.

28. A method of detecting an arc fault between a line conductor electrically connected to a load conductor according to claim 25, further comprising generating an output signal to electrically disconnect the load conductor from the line conductor based on the detection of a ground fault.

29. A method of detecting an arc fault between a line conductor electrically connected to a load conductor according to claim 25, wherein the comparison of the generating step is an absolute difference between the first waveform and the at least one modified signal.

30. A method of detecting an arc fault between a line conductor electrically connected to a load conductor according to claim 25, further comprising:

detecting a ground fault between the conductors; and electrically disconnecting the load conductor from the line conductor based on the detected ground fault.

31. A method of detecting an arc fault between a line conductor electrically connected to a load conductor according to claim 25, wherein the microcontroller generates the output signal to electrically disconnect the load conductor from the line conductor based on the detection of the at least one condition.

* * * * *